United States Patent [19]
Gosser et al.

[11] Patent Number: 5,537,079
[45] Date of Patent: Jul. 16, 1996

[54] INTEGRATED-CIRCUIT (IC) AMPLIFIER WITH PLURAL COMPLEMENTARY STAGES

[75] Inventors: Royal A. Gosser, Reidsville, N.C.; Jeffrey A. Townsend, North Chelmsford, Mass.

[73] Assignee: Analog Devices, Inc., Norwood, Mass.

[21] Appl. No.: 349,261

[22] Filed: Dec. 5, 1994

[51] Int. Cl.$^6$ .................................................. H03F 3/26
[52] U.S. Cl. ........................................ 330/265; 330/267
[58] Field of Search ............................... 330/263, 265, 330/267, 310, 311

[56] References Cited

U.S. PATENT DOCUMENTS 4,502,020  2/1985  Nelson et al. ................... 330/265
4,879,522  11/1989  Mattfeld ....................... 330/267 X Primary Examiner—Steven J. Mottola
Attorney, Agent, or Firm—Parmelee, Bollinger & Bramblett

[57] ABSTRACT

An IC amplifier having first and second cascaded stages formed by respective pairs of symmetrical complementary bipolar transistors followed by a unity gain buffer amplifier and provided with overall current feedback. The quiescent collector currents of the second amplifier stage are controlled by respective transconductance generators with respective complementary bipolar transistors connected in parallel relationship to the transistors of the second stage. The collector currents of the transconductance generators are fixed at the levels of respective reference current generators.

17 Claims, 4 Drawing Sheets

SINGLE STAGE ARCHITECTURE

AC/DC TRANSFER EQUATION
$Z_i$ = OPEN LOOP INPUT IMPEDANCE

INTEGRATED-CIRCUIT (IC) AMPLIFIER WITH PLURAL COMPLEMENTARY STAGES

BACKGROUND OF THE INVENTION

1. Field of the Invention

This invention relates to integrated-circuit (IC) amplifiers. More particularly, this invention relates to IC amplifiers of the type comprising a successive series of cascaded stages with current feedback.

2. Description of the Prior Art

Most operational amplifiers of the integrated complementary type (i.e., having symmetrical NPN/PNP transistors) have been basically of a single gain-stage design. FIG. 1 illustrates a prior art circuit configuration as might be used in a single stage feedback amplifier design.

In this circuit, transistors Q1/Q2 provide level shifting to the bases of inverting input transistors Q3/Q4. Using equal emitter areas for pairs Q1/Q3 and Q2/Q4, the collector currents for Q3/Q4 will be approximately equal. Neglecting finite beta's and transistor output conductance, the collector current Ic(Q3)=Ic(Q4) with IPP=INP and Vn is approximately zero for Vp=0. Second order PNP/NPN mismatch effects such as output conductance (PNP/NPN Early Voltages or VA's), DC beta, IS, etc., are also neglected in this analysis. Assuming matched transistor and resistor pairs Q5/Q7 and RE5/RE7 respectively, 1:1 mirror action results with Q7's collector current (IQ0) approximately equal to IQ1. Likewise, with Q6/Q7 and RE6/RE7 matched, $\overline{IQ0}$ will closely equal $\overline{IQ1}$. With the loop closed from the output of the buffer amplifier A3, negative feedback action results.

Any initial input signal (Vp) variation results in a difference current (ie) at the emitters of common base transistors Q3/Q4. This error current is mirrored and summed at the common collector ports of Q7/Q8, resulting in a voltage transformation (Vo') equal to ie*Z2, where Z2 is the equivalent buffer input port impedance of amplifier A3. This impedance is equal to the total parasitic capacitance CD in parallel with the total parasitic resistance R2 at the input port of buffer amplifier A3 plus any fixed capacitance necessary to maintain adequate loop stability. The total equivalent impedance is designated Z2.

Vo' is buffered by A3 resulting in an output signal (Vo) approximately equal to Vo'. This signal is servoed back through feedback resistor RF which results in a final signal error current Vo/To, where To is the transimpedance gain of the amplifier and is approximately equal to Z2. An input-referred voltage error (Vp–Vn) is also created by the ie*Zi drop that results, where Zi is the open loop inverting input impedance. Its value can be approximated (neglecting Q3/Q4's output conductance) as 1/2 times the thermal emitter resistance of Q3 (or Q4); that is, it is equal to 1/2*gmf. The magnitude of these two errors depends on both the open loop voltage gain (Ao) and transimpedance gain (To) of the amplifier.

The quasi-DC closed loop gain (i.e., gain at frequencies very close to zero) can be expressed as:

$$Vo/Vp = Av = \frac{G}{1 + \frac{G*Ri}{To} + \frac{RF}{TO}} = \frac{G}{1 + \frac{G}{Ao} + \frac{RF}{TO}}$$

Where Ao=gmf÷2*R2 To=R2 and G=1+RF/RN (non-inv) R2 is the real component of Z2.

Using the above gain expression, the input referred error signal can be expressed as:

$$Vp-Vo/G=G/Ao+RF/To$$

Being of a "single stage" design, the open loop gain (To and Ao) of the FIG. 1 circuit will generally be lower than a true two-stage amplifier. Note that Q5/RE5 with parallel Q7/RE7 form a 1:1 current mirror and no amplification is generated. Though current gains (IQ0/IQ1) greater than one can be realized, excessive power would quickly result due to both the magnitude of the signal current and quiescent collector current of Q7/Q8 increasing equally. Though higher loop gain could be realized by using a quad or modified Wilson for the mirror stages (not shown), output voltage swing range would be reduced.

Non-linear drive impedance at the buffer (A3) input port due in part to the non-linear component of the parasitic capacitance CD and to buffer input reflected non-linear loads will result as approximately a 1 to 1 input referred distortion current. This non-linear current would be multiplied by RF when reflected back to the output. The two-stage design described below essentially divides these distortion effects down by the gain of the first stage (A1/$\overline{A1}$) which is much greater than one. This results in relatively superior DC through mid-band distortion.

Using two gain-stages versus one can result in a higher overall gain bandwidth product (GBWP) for the same phase margin. This results in a combination of realizing wider closed loop bandwidths (CLBW) and/or lower AC distortion. Additional benefits include the capability to improve signal to-noise performance. Any equivalent (self-generated) collector noise currents at the collector ports of Q7/Q8 are basically vector summed and 1:1 reflected back to the input as an equivalent input noise current. For 1:1 mirror action, this current can be relatively higher. With the two-stage structure, this noise current can be viewed as an equivalent input noise voltage at the second stage (A2/$\overline{A2}$) inputs. This noise voltage is divided down by the output impedance of A1/$\overline{A1}$ (Z1/$\overline{Z1}$) and typically will be much higher than a single stage.

At DC and low frequencies, relatively more standing (quiescent) power is required for the single stage amplifier versus the two stage for "heavy" loads for the same buffer architecture. For heavy resistive loads and maximum voltage swing, the buffer input referred load current can determine the overall minimum standing current or power required. At low temperatures, transistor beta's are minimum, and the buffer reflected load current can be several hundred microamps. This criterion directly determines the overall minimum quiescent power attainable. Running lower equivalent standing current will result in an exponential loss in loop gain at the signal output extremes. A compounded buffer scheme can partially alleviate this condition although at the expense of reduced voltage swing. The two-stage design again divides down this buffer reflected load current by the current gain (beta) of the additional stage. This allows for relatively much lower input stage (Q3/Q4) quiescent collector current.

SUMMARY OF THE INVENTION

In a preferred embodiment of the invention, to be described hereinbelow in detail, there is provided a two-stage IC amplifier wherein both stages are symmetrically arranged in a push-pull differential configuration using corresponding complementary NPN and PNP transistors in the signal path. The amplifier includes an additional control circuit in the form of complementary gm generators (i.e., transconductance generators) for controlling the collector currents of the transistors of the second stage. This stabilizes the quiescent collector currents permitting important improvements in amplifier gain characteristics. Other objects, aspects and advantages of the invention will in part be pointed out in, and in part apparent from, the following detailed description of a preferred embodiment considered together with the accompanying drawings.

DESCRIPTION OF THE PREFERRED EMBODIMENT

Figure 1:
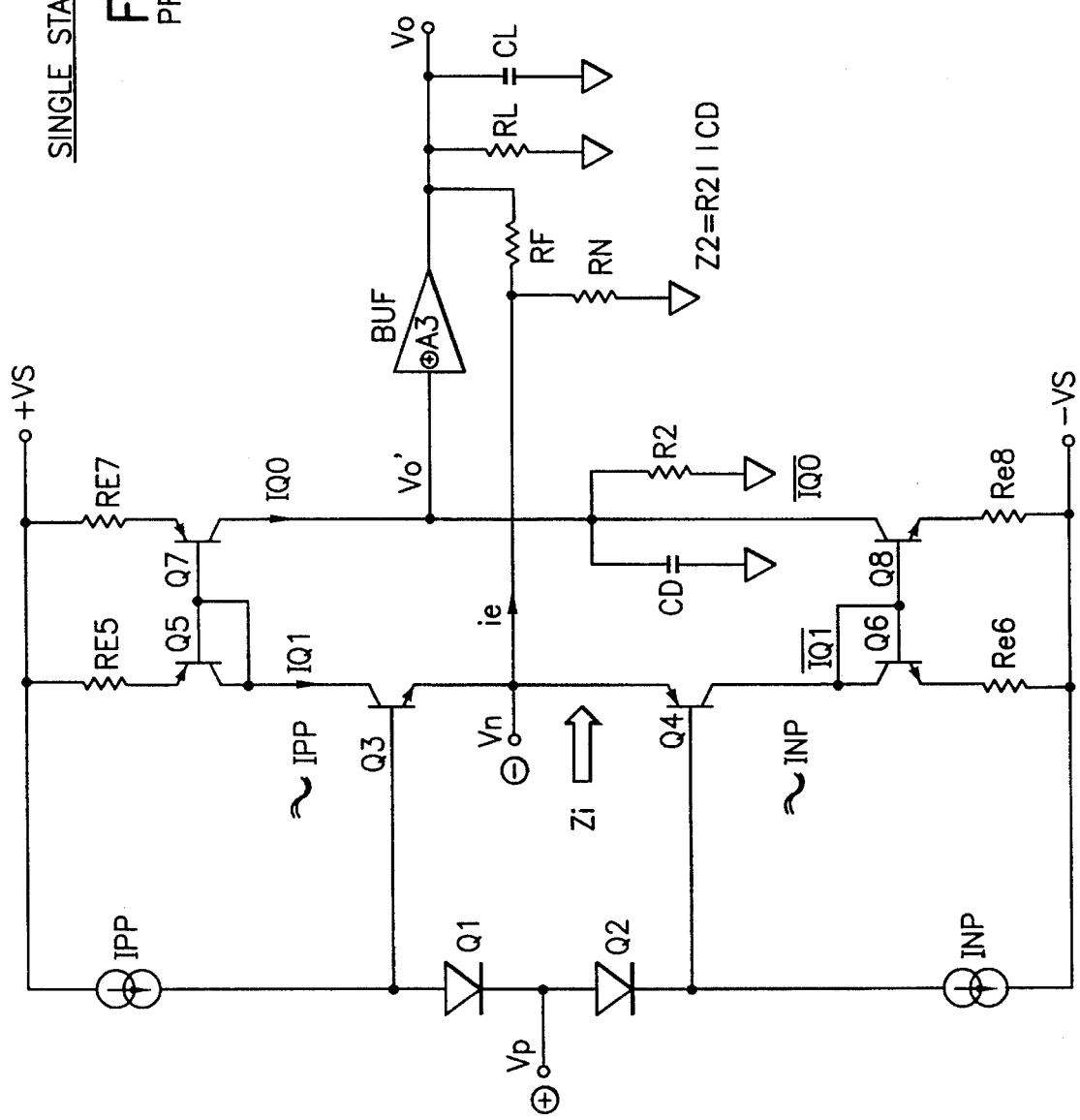
FIG. 1 is a circuit diagram illustrating aspects of a single-stage IC amplifier as known in the prior art.
Figure 2:
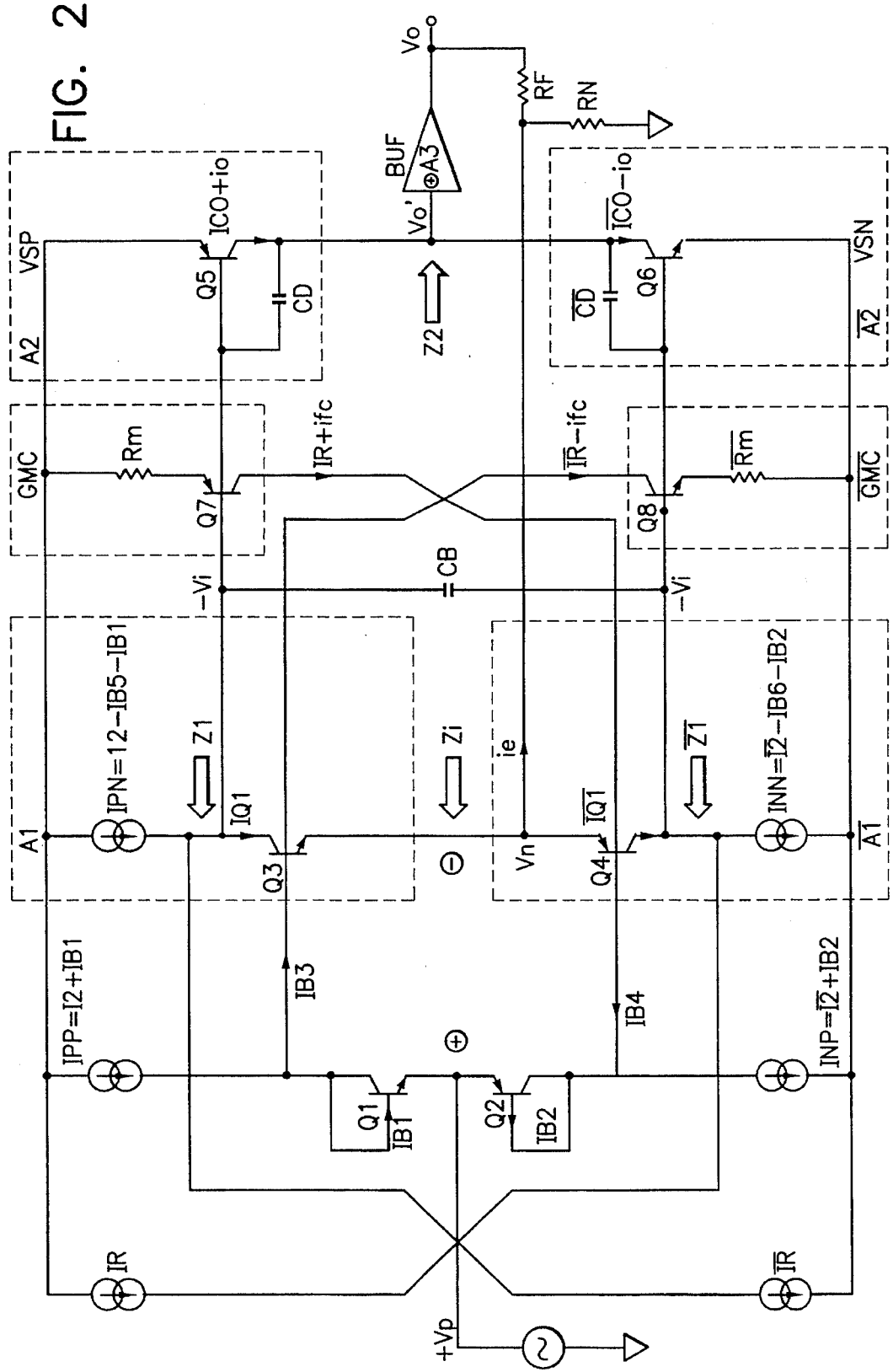
FIG. 2 is a circuit diagram (somewhat simplified) illustrating features of the present invention.

Referring now to FIG. 2, transistors Q1/Q2 provide input level shifting to the bases of inverting (common base) input transistors Q3/Q4. With Q1 and Q2 collector currents initially equal to I2–IB1 and $\overline{I2}$–IB2 respectively and using equal emitter areas for pairs Q1/Q3 and Q2/Q4, there will be equal emitter currents for Q3/Q4. With reference current IR=the other reference current $\overline{IR}$, Q7 and Q8 are forced to servo current back to diodes Q2 and Q1 until stable equilibrium is reached. At equilibrium, Ic(Q7)=IR and Ic(Q8)= $\overline{IR}$. Neglecting transistor VA's (Early Voltages), Ic(Q3)=I2–$\overline{IR}$–IB1 (base current of Q1)=Ic(Q1) and Ic(Q4)= $\overline{I2}$–IR–IB2 (base current of Q2)=Ic(Q2). Letting IR=$\overline{IR}$, the inverting input error current ie is equal to zero.

The collector currents (ICO/$\overline{ICO}$) of the output stage transistors Q5/Q6 are directly controlled by respective gmc (transconductance) generators Q7/Rm and Q8/$\overline{Rm}$ the emitter-base circuits of which are connected in parallel with the corresponding transistors Q5 and Q6 respectively. With Ic (Q7/Q8) equal to IR, Ic(Q5/Q6) is equal to: $\overline{ICO}$ is approximately equal to $$IR * K * e^{\frac{IR * R1}{VT}}$$

which is equal to ICO, where K is the emitter area ratio of Q5 to Q7 and Q6 to Q8.

The gmc generators (labelled gmc and $\overline{gmc}$) desensitize variations in Q5/Q6's common mode collector output current (ICO/$\overline{ICO}$) due to finite beta mismatches, current source mismatches, and finite output conductances (primarily the VA's of Q3/Q4). Any common mode net current error (ine) at the Z1/$\overline{Z1}$ ports would result in beta (β) multiplied current variations at the Q5/Q6 collector ports. The gmc feedback generators reduce this beta sensitivity by gmc/gmo. The variation in Q5 or Q6's output current can be approximated by the following relationship:

$$\Delta ICO = \frac{B * ine}{1 + \frac{B * gmc}{gmo}}$$

where $\overline{gmc}$ is approximately equal to gmc=gm7*1/(1+ Rm*gm7) and gm7 is the transconductance for Q7 which is approximately equal to gm8=IR/VT.

PNP-NPN mismatch effects such as transistor output conductance (A), DC beta including IS matching of the same type, etc., are considered differential mode and primarily reflect as an inverting input voltage offset (Vn) and/or current offset (Ie) with Vp=0.

Any initial input signal variation (Vp) results in a difference current (ie) at the emitters of common base transistors Q3/Q4. This error current is approximately divided equally between Q3/Q4. Letting Z1=$\overline{Z1}$, an output voltage signal (Vi) results at the bases of Q5/Q6. The first voltage stage of amplification (A1/$\overline{A1}$) can be viewed both as current to voltage transformation (Z1*Ie) and as a voltage gain stage with A1=Z1*gmf=$\overline{A1}$ where gmf is the thermal emitter resistance of Q3/Q4.

Common emitter transistors Q5/Q6 along with dominant pole parasitic capacitors CD/$\overline{CD}$ provide a second stage of amplification. This second gain stage (A2/$\overline{A2}$) can be quasi-dc approximated as a voltage gain of gmo*R2 where gmo is Q5/Q6's thermal emitter transconductance and R2 is the total equivalent parasitic load resistance at A3's input port. A2/$\overline{A2}$'s output signal (designated Vo') is buffered by A3 resulting in an output signal (Vo) essentially equal to Vo'. This signal is servoed back through feedback resistor RF, thus reducing the initial signal error current to a value of Vo/To, where To is the transimpedance gain of the amplifier. An input referred differential voltage error (Vp–Vn) is also created by the ie*Ri drop that results with Ri approximately equal to 1/2 gmf (neglecting the VA's of Q3/Q4).

Figure 3:
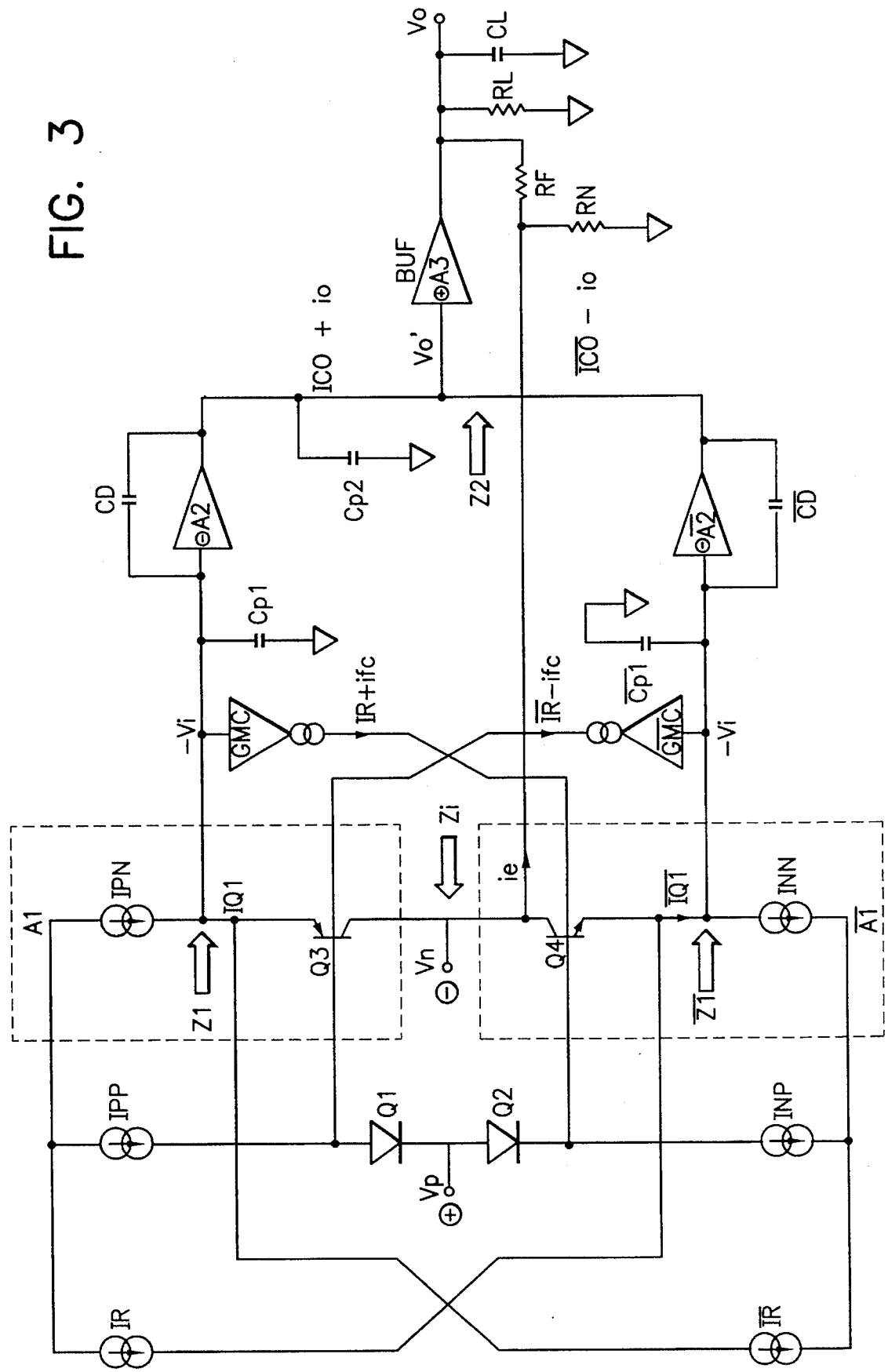
FIG. 3 is a block diagram corresponding to FIG. 2.

Referring also to FIG. 3, gain stages A1/$\overline{A1}$ and A2/$\overline{A2}$ combined provide negative feedforward transresistance gain. Stages GMC/$\overline{GMC}$ are transconductance feedback generators that provide both common mode quiescent current control for A2/$\overline{A2}$ (see above) while also reducing overall closed loop gain error at low gains. That is, that the gmc generators provide common mode collector current control for Q5/Q6, the quiescent current control operates to stabilize the output stage gain in such a way as to prevent the common mode collector current from going to zero or infinity.

Stage A3 is a unity gain buffer which provides external load isolation to A2/$\overline{A2}$ thus increasing the amplifier open loop gain and "DC precision". Each stage uses a symmetrical complementary design. (A3 also may use a complementary design.) This reduces second order signal distortion and overall quiescent power as discussed above. In the quasi-dc to low-frequency region, the closed loop gain relationship can be approximated as:

G=1+RF/RN for non-inverting operation

G=–RF/RN for inverting operation

These basic relationships above are common to all traditional operational amplifiers. Due to the inverting input error current (Ie) required to servo the output and the inverting Ie*Ri drop (error current times the open loop inverting input resistance) that results, a more exact low frequency closed loop transfer function can be described as:

$$AV = \frac{G}{1 + \frac{G * Ri}{To} + \frac{RF}{To}} = \frac{G}{1 + \frac{G}{Ao} + \frac{RF}{To}}$$

for non-inv, with G positive $$AV = \frac{G}{1 + \frac{1-G}{Ao} + \frac{RF}{To}}$$

for inv, with G negative
(Where G is the ideal gain defined above).
With Ri=To/Ao, the second expression (positive G) relates to the classical voltage feedback "op-amp" equation with To omitted due to its relatively much higher value and thus insignificant effect. Ao and To are the open loop DC voltages and transresistance gains of the amplifier respectively.

These key transfer variables can be described as:

$$Ao = \frac{R1 * gmf * |A2|}{(1 - gmc * R1)}$$

and $$To = \frac{R1 * |A2|}{2};$$

therefore $$Ri = \frac{1 - gmc * R1}{2 * gmf}$$

The gmc*R1 product has a negative design value that results in a negative DC open loop voltage gain (Ao). Though atypical of conventional operational amplifiers, this negative open loop voltage gain results in an input referred error term Vp−Vo/G=G/Ao+RF/To that typically will be negative for "high" external gains (G). As an example, for G=10, Ao=−2500, RF=1k and To=1.2M, an error of −3 mv results using the Av derivation above.

Figure 4:
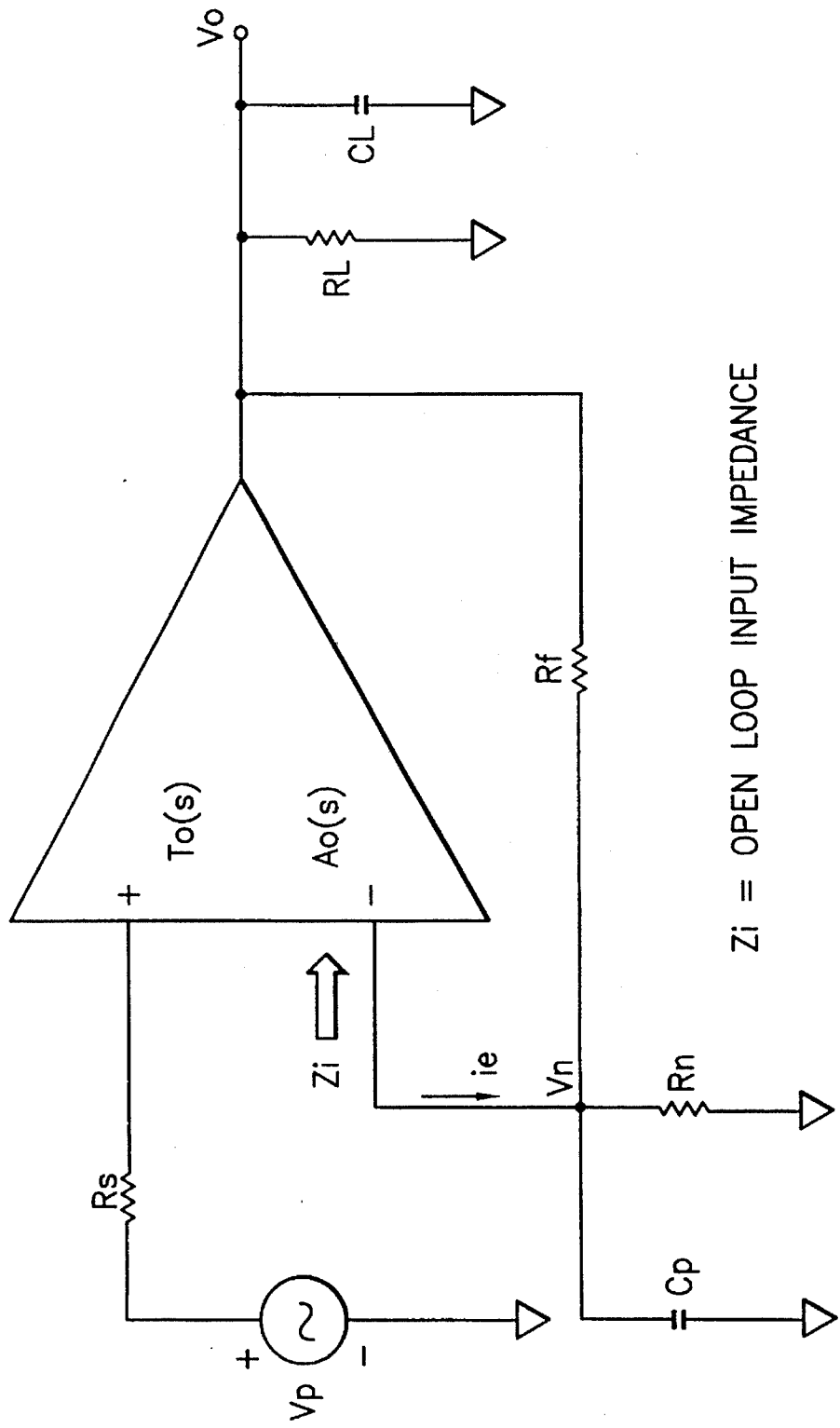
FIG. 4 is a block diagram used in explaining the derivation of certain mathematical relationships.

Referring also to FIG. 4, The basic "DC" derivations above assume that Rs (equivalent non-inverting input driving resistance) is less than 1/2 gmf. To include Rs, the gmc variable used above would be modified to: gmc (1+RS*gmf). In addition, this analysis assumes perfect current sources and infinite transistor VA's (Q3/Q4/IP/IN output conductances are assumed zero). These assumptions result in actual vs model open loop voltage gain and associated input referred error terms being less accurate for low external non-inverting gain operation at frequencies below the open loop pole of the disclosed amplifier. This is primarily a result of the input signal (Vp) modulating the output conductances of Q3/Q4 resulting in Ri less negative than defined here. For inverting operation, the actual vs model DC error terms are relatively much less since Q3/Q4 has relatively much lower Vce signal modulation.

AC TRANSFER CHARACTERISTICS

The AC small signal transfer derivations below are based on a simplified single pole model. In practice, inaccuracies due in part to internal parasitic capacitances (CP1/$\overline{CP1}$/CP2), finite gmo's of Q5/Q6, etc., can result in gain/phase discrepancies at frequencies approaching the actual closed loop bandwidth (CLWB) of this new amplifier. In addition, package parasites, such as inverting input pin capacitance, will extend non-inverting "low gain" BW's beyond these single pole simplifications. Nevertheless, they still provide a fair approximation to the salient AC characteristics of the device.

To accurately quantify the Vo vs Vp relationship, both Ao(s) and To(s) need to be derived (s=jw). This can be seen by the following non-expanded non-inverting gain relationship:

$$Vo(s)/Vp(s) = \frac{G}{\frac{G}{Ao[s]} + \frac{RF}{To[s]} + 1}$$

$$\text{With } Ao(s) = \frac{\frac{R1 * gmf * |A2|}{1 - gmc * R1}}{\frac{s\tau 1}{1 - gmc * R1} + 1}$$

Where R1 is the input resistance to A2/$\overline{A2}$, τ1 (approximately equal to CD*R1*A2) is the open loop dominant time constant, $$\text{and } To(s) = \frac{\frac{|A2| * R1}{2}}{s\tau 1 + 1}$$

Again 1−gmc,R1 is negative, resulting in Ao(s) having a right half plane pole. In the time domain (inverse Laplace of Ao) it appears unstable, causing Vo to exponentially rail out of its linear region. When the loop is closed however, the BW is greatly extended and the transimpedance gain, To(s), "overrides" and directly controls the amplifier stability behavior due to Zi approaching 1/2 gmf for s>>1/τ1. This can be seen by the Zi(s) and Vo(s) non-inverting transfer equations below (for inverting gain, denominator G in Av(s) is replaced with 1−G) where:

$$Zi(s) = \frac{(1 - gmc * R1)[s\tau 1/(1 - gmc * R1) + 1]}{2 * gmf(s\tau 1 + 1)}$$

$$AV(s) = \frac{G}{\frac{[1 + G/Ao + RF/To]}{[s\tau 1(G/2 \, gmf * To + Rf/To) + 1]}}$$

Zi(s) goes positive real and approaches 1/2 gmf as w (omega) approaches (1−gmc,R1)/τ1. This results in the input resistance for the Av(s) complex term being 1/2 gmf. Using the Av(s) derivation above, the 3 dB BW is equal to the open loop corner frequency:

$$\frac{1}{(2\pi\tau 1)} * \left[ \frac{1}{G/2 \, gmf * To + RF/To} \right]$$

This 3 db BW is controlled primarily by the RF/To term for low gains and G/2 gmf*To for high gains.

Although a specific preferred embodiment of the invention has been disclosed herein in detail, it is to be understood that this is for the purpose of illustrating the invention, and should not be construed as necessarily limiting the scope of the invention since it is apparent that many changes can be made by those skilled in the art while still practicing the invention claimed herein. For example, although bipolar transistors are disclosed for the amplifier circuitry, MOS devices also can be employed if desired.

What is claimed is:

1. An IC amplifier having input and output circuits and comprising:

first and second cascaded stages each with a pair of complementary transistors connected in push-pull differential configuration;

feedback means providing feedback from the amplifier output circuit to the amplifier input circuit; and a current control stage comprising a pair of complementary transistors connected to respective current sources and operable to control and stabilize the currents of both transistors of said second stage;

the bases of said current control stage transistors being connected respectively to the bases of said transistors of said second stage.

2. An IC amplifier as in claim 1, wherein said transistors are bipolar devices (NPN and PNP) each having an emitter, base and collector;

said current control stage being operable to stabilize the collector currents of said second stage pair of transistors.

3. An IC amplifier as in claim 2, wherein said first and second stages are input and output stages respectively;

said current control stage being operable to control the quiescent collector currents of said output stage.

4. An IC amplifier as in claim 1, wherein said current control stage comprises a pair of transconductance current generators.

5. An IC amplifier as in claim 4, wherein said transconductance current generators comprise a pair of complementary bipolar transistors each connected in a parallel relationship with the corresponding transistors of said output stage.

6. An IC amplifier as in claim 5, including resistors connected respectively between the emitters of said current generator transistors and the corresponding power rails.

7. An IC amplifier as in claim 6, wherein the collectors of said current generator transistors are supplied with reference currents provided by respective reference current generators.

8. An IC amplifier having input and output circuits and comprising:

first and second cascaded stages each with a pair of series-connected complementary bipolar transistors connected in push-pull differential configuration; and a current control stage comprising a pair of complementary bipolar transistors connected to respective current sources, said current control stage transistors serving as transconductance generators coupled to the transistors of said second stage to control and stabilize the collector currents of both transistors of said second stage.

9. An IC amplifier as in claim 8, including first and second current sources connected respectively to the transistors of said first stage to supply controlled current thereto.

10. An IC amplifier as in claim 8, wherein said transistors of said current control stage are arranged as transconductance current generators.

11. An IC amplifier as in claim 8, including circuit means coupling said second stage to said first stage to provide servoing of current through said first stage to control the common-mode current of said second stage.

12. An IC amplifier having input and output circuits and comprising:

first and second cascaded stages each with a pair of series-connected complementary bipolar transistors connected in push-pull differential configuration;

a current control stage comprising a pair of complementary bipolar transistors connected to respective current sources and coupled to said second stage pair of transistors to control and stabilize the collector currents of both transistors of said second stage; and circuit means connecting the bases of said pair of transistors of said second stage to respective bases of said pair of transistors of said current control stage.

13. An IC amplifier as in claim 12, including first and second resistors connected between the emitters of said current control stage transistors and respective power lines.

14. An IC amplifier as in claim 12, wherein said current sources are connected respectively to the collectors of said current control stage transistors.

15. An IC amplifier as in claim 14, including a pair of diodes connected in series between said current sources;

the common connection between said diodes serving as one input terminal of the amplifier.

16. An IC amplifier as in claim 12, including a pair of current sources connected respectively to the collectors of said pair of first stage transistors to provide reference currents thereto.

17. An IC amplifier as in claim 12, wherein the emitters of said current control stage transistors are connected respectively to corresponding power lines;

said emitter resistors being connected in parallel with the emitter circuits of said second stage transistors.

* * * * *